(12) United States Patent
Adams et al.

(10) Patent No.: US 8,024,693 B2
(45) Date of Patent: Sep. 20, 2011

(54) CONGESTION OPTIMIZATION DURING SYNTHESIS

(75) Inventors: Jay K. Adams, San Carlos, CA (US); Qingzhou Wang, Sunnyvale, CA (US); Yong Xiao, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 352 days.

(21) Appl. No.: 12/264,432

(22) Filed: Nov. 4, 2008

(65) Prior Publication Data

US 2010/0115476 A1     May 6, 2010

(51) Int. Cl.
*G06F 17/50* (2006.01)
*G06F 9/455* (2006.01)

(52) U.S. Cl. ......... 716/132; 716/104; 716/129; 716/130

(58) Field of Classification Search .................. 716/129, 716/130, 132, 104
See application file for complete search history.

(56) References Cited

U.S. PATENT DOCUMENTS

| | | | | |
|---|---|---|---|---|
| 5,587,923 | A | * | 12/1996 | Wang ............................ 716/129 |
| 5,914,887 | A | * | 6/1999 | Scepanovic et al. .......... 716/123 |
| 6,360,352 | B2 | | 3/2002 | Wallace |
| 6,473,885 | B1 | | 10/2002 | Wallace |
| 6,477,688 | B1 | | 11/2002 | Wallace |

OTHER PUBLICATIONS

Esbensen et al.; "An Interactive Floorplanner for Design Space Exploration"; Sep. 1996; IEEE; pp. 356-361.*
Wu et al.; "Congestion Aware High Level Synthesis Combined with Floorplanning"; Dec. 2008; College of Computer Science Qufu Normal University; pp. 935-938.*
Wang et al.; "A Congestion Driven Re-Synthesis Method After Floorplanning"; May 2005; Deparment of Computer Science and Technology Tsinghua University; p. 1220-1224.*

* cited by examiner

*Primary Examiner* — Suresh Memula
(74) *Attorney, Agent, or Firm* — Park, Vaughan, Fleming & Dowler LLP

(57) ABSTRACT

One embodiment of the present invention provides a system that optimizes a circuit design during a logic design stage to reduce routing congestion during a placement and routing stage. During operation, this system identifies a first circuit structure in the circuit design which is expected to cause routing congestion during the placement and routing stage. Next, the system generates a second circuit structure which is functionally equivalent to the first circuit structure, and is not expected to cause routing congestion during the placement and routing stage. The system then replaces the first circuit structure in the circuit design with the second circuit structure, thereby mitigating routing congestion during the placement and routing stage.

24 Claims, 13 Drawing Sheets

CONGESTION OPTIMIZATION DURING SYNTHESIS

BACKGROUND

1. Field of the Invention

The present invention generally relates to electronic design automation. More specifically, the present invention relates to techniques and systems for optimizing a circuit design during a logic design stage to reduce routing congestion during a placement and routing stage.

2. Related Art

Performing a routing operation on a circuit design's netlist is an expensive process which can take several days to complete. To make matters worse, the routing operation is not always guaranteed to succeed. In some situations, standard cell routing does not succeed because a region of the microchip does not have sufficient wiring resources for routing the signal interconnections that exist in that region. This situation is typically known as routing congestion.

Routing congestion is often mitigated by using a cell placement algorithm to complement a routing operation, and produce an optimized physical implementation from the netlist of a circuit design. This placement algorithm attempts to spread out standard cells in areas of the physical implementation where the algorithm believes that congestion will occur. However, many cases still exist where the placement algorithm cannot resolve every congestion issue on the physical implementation.

SUMMARY

One embodiment of the present invention provides a system, comprising methods and apparatuses, that optimizes a circuit design during a logic design stage to reduce routing congestion during a placement and routing stage. The logic synthesis stage optimizes the circuit design and generates a circuit netlist which includes a set of circuit instances and describes a number of interconnections between the instances. The placement and routing stage is performed after the logic synthesis stage to determine a physical placement for the circuit instances of the netlist, and to determine a routing path for the interconnections of the netlist.

During the logic synthesis stage, the system identifies a first circuit structure in the circuit design which is expected to cause routing congestion during the placement and routing stage. This first circuit structure includes a first set of interconnections between a first set of signal sources and a first set of signal loads, wherein the first set of interconnections causes a first number of crossovers in the first circuit structure, and wherein the first number of crossovers are expected to cause routing congestion during the placement and routing stage.

Next, the system generates a second circuit structure which is functionally equivalent to the first circuit structure, and is not expected to cause routing congestion during the placement and routing stage. This second circuit structure includes a second set of interconnections between a second set of signal sources and a second set of signal loads, wherein the second set of interconnections causes a second number of crossovers in the second circuit structure which is substantially less than the first number of crossovers.

The system then replaces the first circuit structure in the circuit design with the second circuit structure, thereby substantially reducing crossovers in the circuit design, which, in turn, reduces routing congestion during the placement and routing stage.

In some embodiments, the system identifies the first circuit structure in the circuit design by determining whether the first circuit structure implements a set of sums-of-products expressions. The set of sums-of-products expressions are associated with a common set of M minterms, and a respective sum-of-products expression is a disjunction of at most M minterms. Furthermore, to generate the second circuit structure, the system determines an ordering for the set of M minterms, and generates a minterm table for a respective sum-of-products expression. This minterm table includes the set of minterms associated with the respective sum-of-products expression. Next, the system partitions the minterm table into P table partitions, such that the minterms of a first partition are disjoint from a second partition, and the system generates a sum-of-products circuit structure for a respective table partition. The system then generates a Boolean OR logic structure for the respective sum-of-products expression to combine the outputs from the sum-of-products circuit structures of the P table partitions.

In some embodiments, the system identifies the first circuit structure in the circuit design by determining whether the first circuit structure comprises at least M signal loads for one or more signal sources. Furthermore, to generate the second circuit structure, the system selects l levels of logic associated with the M signal loads, and partitions the selected logic into at most P partitions by performing a min-cut partitioning on the selected logic. Then, for a respective signal source, the system couples the input signals of a respective partition to the output of a corresponding buffer, and couples the input of the corresponding buffer to the respective signal source. In some variations to these embodiments, the system can couple the inputs of a respective buffer to the output of a corresponding input buffer, and couple the input of the corresponding input buffer to a corresponding signal source.

In some embodiments, the system identifies the first circuit structure in the circuit design by determining whether the first circuit structure implements a read-only-memory (ROM) circuit structure. Furthermore, to generate the second circuit structure, the system partitions the ROM circuit structure into at most $P=2^k$ partitions. The ROM circuit structure has an M-bit address input, and a respective partition has an address input of M-k bits. The system then couples the output signals of a respective partition to a corresponding entry of a P-way multiplexer, such that the P-way multiplexer has a select input of k bits.

In some embodiments, the system identifies the first circuit structure in the circuit design by determining whether the first circuit structure is a multiplexer circuit structure. The multiplexer has at most $N=2^M$ input signal sources, and has a select input of M bits. Furthermore, to generate the second circuit structure, the system partitions the multiplexer circuit structure into at most $P=2^k$ partitions, such that a respective partition has a select input of M-k bits. The system then couples the output signals of a respective partition to a corresponding entry of a P-way multiplexer, such that the P-way multiplexer has a select input of k bits.

In some embodiments, the system identifies the first circuit structure in the circuit design by determining whether the circuit structure is shared by at least M signal loads. Furthermore, to generate the second circuit structure, the system selects l levels of logic associated with the M signal loads, and partitions the selected logic into at most P partitions by performing a min-cut partitioning on the selected logic. The system then produces an instantiation of the first circuit structure for each of the P partitions of signal loads, and couples the outputs of a respective instantiation to the corresponding inputs of a corresponding partition.

In some embodiments, the system identifies the first circuit structure in the circuit design by determining whether the first circuit structure implements a decompression logic for M design-for-test (DFT) scan chains. The decompression logic produces a set of output signals, where a respective output signal drives a corresponding DFT scan chain, and a respective DFT scan chain is implemented by a register chain. Furthermore, to generate the second circuit structure, the system partitions the M scan chains into P partitions of scan chains. The system then generates a custom implementation of the DFT decompressor for a respective DFT scan chain in a partition $P_i$ by sharing logic with custom DFT decompressor implementations associated with other scan chains in partition $P_i$.

In some embodiments, the system identifies the first circuit structure in the circuit design by determining whether the first circuit structure implements a compression logic for M design-for-test (DFT) scan chains, where a respective DFT scan chain is implemented by a register chain. The compression logic comprises M input signal loads, and produces a compressed signal output for the M DFT scan chains. Furthermore, to generate the second circuit structure, the system first determines an ordering for the M DFT scan chains based on their placement sequence, and determines an ordering for the M signal loads of the compression logic based on their placement sequence. The system then couples the output signals of the M DFT scan chains to the M input signal loads of the compression logic based on their corresponding orderings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Integrated Circuit (IC) Design Flow

Figure 1:
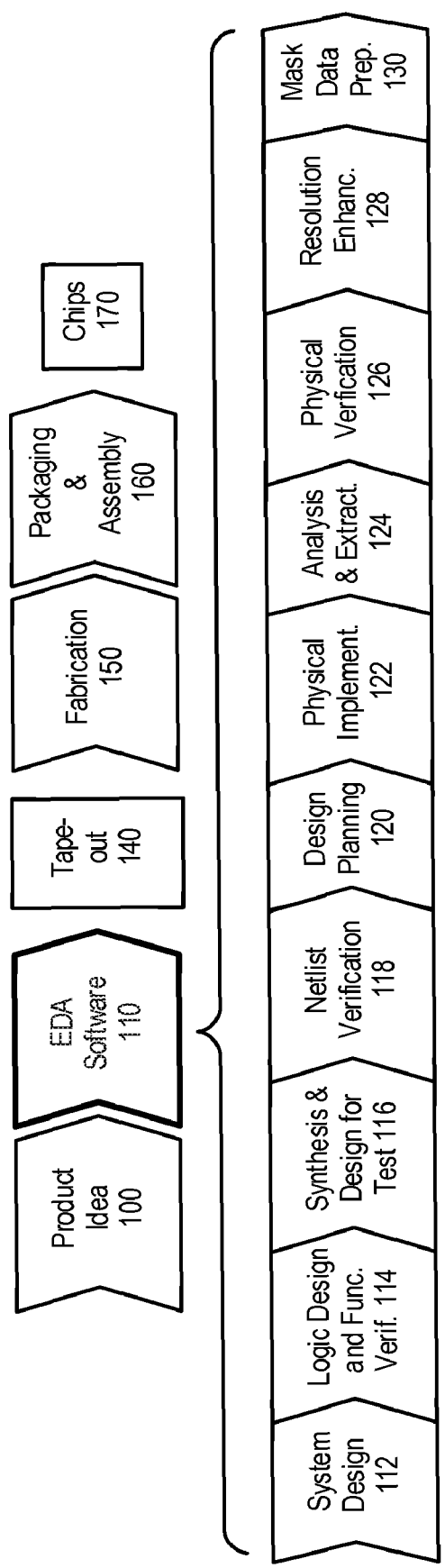
FIG. 1 illustrates various stages in the design and fabrication process of an integrated circuit in accordance with an embodiment of the present invention.

FIG. 1 illustrates various stages in the design and fabrication process of an integrated circuit in accordance with an embodiment of the present invention.

The IC design process typically begins with a product idea (operation 100) which is realized using an EDA process (operation 110). Once the design is finalized, it is typically taped-out (event 140), at which point it goes through a fabrication process (operation 150) and packaging and assembly processes (operation 160) to produce manufactured microchips (result 170).

The EDA process (operation 110) comprises operations 112-130, which are described below for illustrative purposes only and are not meant to limit the present invention. Specifically, an actual integrated circuit design may require a designer to perform the design operations in a different sequence than the sequence described below.

System design (operation 112): In this stage, the designers describe the functionality that implements the product idea. They can also perform what-if planning to refine the functionality, perform cost analysis, etc. Hardware-software architecture partitioning can occur at this stage. Exemplary EDA software products from Synopsys, Inc. that can be used at this stage include Model Architect, Saber®, System Studio, and DesignWare®.

Logic design and functional verification (operation 114): At this stage, the VHDL or Verilog code for modules in the system is written and the design is checked for functional accuracy. More specifically, the design is checked to ensure that it produces a correct response. Exemplary EDA software products from Synopsys, Inc. that can be used at this stage include VCS®, Vera®, DesignWare®, Magellan™, Formality®, ESP and Leda®.

Synthesis and design for test (operation 116): The VHDL/Verilog source code can be translated to a netlist in this stage. The netlist can be optimized for the target technology, and tests can be designed and implemented to check the manufactured microchips. Exemplary EDA software products from Synopsys, Inc. that can be used at this stage include Design Compiler®, Physical Compiler®, Test Compiler, Power Compiler™, FPGA Compiler, TetraMAX®, and DesignWare®.

Netlist verification (operation 118): In this stage, the netlist is checked for compliance with timing constraints and for correspondence with the VHDL/Verilog source code. Exemplary EDA software products from Synopsys, Inc. that can be used at this stage include Formality®, PrimeTime®, and VCS®.

Design planning (operation 120): In this stage, an overall floorplan for the microchip is constructed and analyzed for timing and top-level routing. Exemplary EDA software products from Synopsys, Inc. that can be used at this stage include Astro™ and IC Compiler products.

Physical implementation (operation 122): The placement (positioning of circuit elements) and routing (placement of interconnections) occur at this stage. Exemplary EDA software products from Synopsys, Inc. that can be used at this stage include Astro™ and IC Compiler products.

Analysis and extraction (operation 124): At this stage, the circuit function is verified at a transistor level; this, in turn, permits what-if refinement. Exemplary EDA software products from Synopsys, Inc. that can be used at this stage include AstroRail™, PrimeRail, PrimeTime®, and Star-RCXT™.

Physical verification (operation 126): In this stage, the design is checked to ensure correctness for manufacturing, electrical issues, lithographic issues, and circuitry. Hercules™ is an exemplary EDA software product from Synopsys, Inc. that can be used at this stage.

Resolution enhancement (operation 128): This stage involves geometric manipulations of the layout to improve manufacturability of the design. Exemplary EDA software products from Synopsys, Inc. that can be used at this stage include Proteus/Progen, ProteusAF, and PSMGen.

Mask data preparation (operation 130): This stage provides the "tape-out" data for production of masks to produce finished chips. Exemplary EDA software products from Synopsys, Inc. that can be used at this stage include the CATS® family of products.

Overview

The placement and routing stage of an IC design process can fail to generate a physical implementation of a circuit design as a result of routing congestion. Routing congestion occurs when a physical implementation of a circuit design includes a substantial number of crossovers between interconnections of the circuit design, regardless of how the logic instances of the circuit design are placed across the physical implementation, and regardless of how the interconnections are routed across the physical implementation.

Routing congestion on a circuit design's physical implementation is largely influenced by the netlist topology of the circuit design. The netlist topology is the result of a multitude of arbitrary decisions made during logic synthesis. Many of these decisions are believed to decrease the die size or to improve the performance of the manufactured microchip. Ironically, there are occasions when these size and performance optimizations are the cause for routing congestion on a physical implementation, which effectively cuts away at the intended performance gains.

Embodiments of the present invention provide a logic synthesis system which can generate a netlist topology that mitigates routing congestion. This logic synthesis system mitigates the routing congestion problem early in the IC design process by promoting decisions during the logic synthesis process which avoid netlist topologies that are expected to cause routing congestion. More specifically, some embodiments mitigate routing congestion by avoiding netlist topologies which share logic over long distances, while other embodiments do so by avoiding netlist topologies which cause an undesired number of crossovers between interconnections of the circuit design.

In some embodiments, the optimizations performed by the logic synthesis system to mitigate routing congestion can be counter-intuitive from typical size and performance optimizations. The optimizations performed by the logic synthesis system can mitigate routing congestion by reconstructing the logic topology for circuit structures which include an undesired number of crossovers between interconnections, and by not employing certain size and performance optimizations which promote logic sharing across a number of signal loads.

Figure 2:
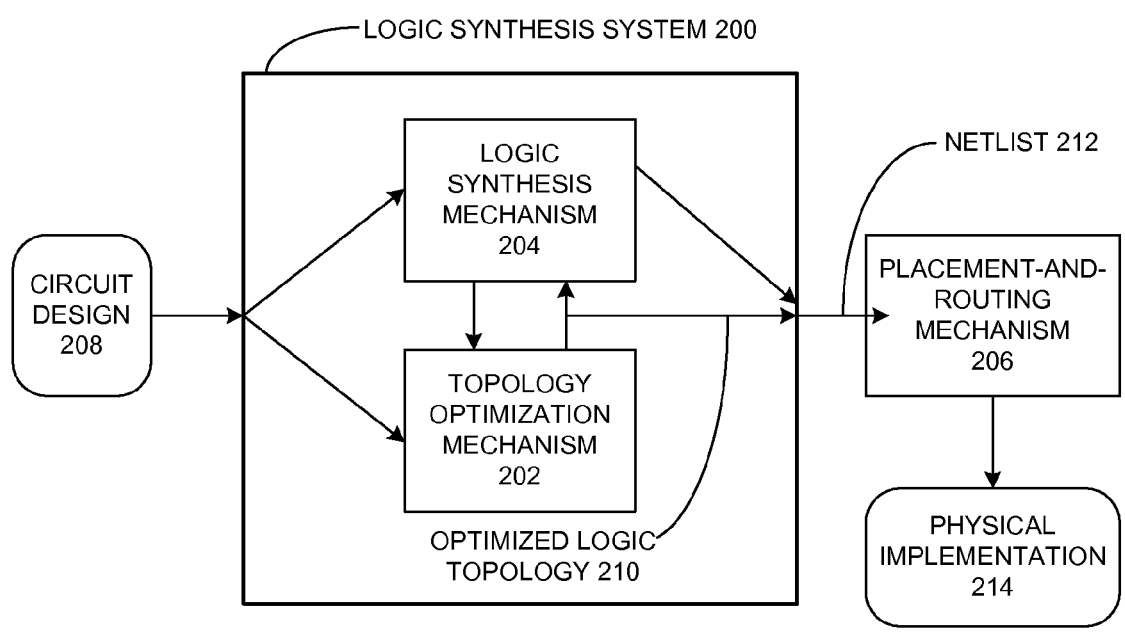
FIG. 2 illustrates a logic synthesis system which is capable of producing a netlist for a circuit design which can mitigate routing congestion in accordance with an embodiment of the present invention.

FIG. 2 illustrates a logic synthesis system 200 which is capable of producing a netlist 212 for a circuit design 208 which can mitigate routing congestion in accordance with an embodiment of the present invention. Logic synthesis system 200 includes a topology optimization mechanism 202, and a logic synthesis mechanism 204.

During operation, topology optimization mechanism 202 receives a circuit design 208, and can generate an optimized logic topology 210 for circuit design 208. In doing so, topology optimization mechanism 202 manipulates the logic topology of circuit design 208 into a logic topology which can prevent logic synthesis system 200 from generating a netlist structure that is known to cause routing congestion. In some variations to this embodiment, topology optimization mechanism 202 generates an optimized logic topology 210 from circuit design 208 before logic synthesis system 200 uses a logic synthesis mechanism 204 to generate netlist 212 from optimized logic topology 210. In other variations, topology optimization mechanism 202 generates optimized logic topology 210 for logic synthesis mechanism 204 while logic synthesis mechanism 204 is generating netlist 212 from circuit design 208. In yet other variations, topology optimization mechanism 202 generates an optimized logic topology 210, in the form of an optimized netlist, from a netlist produced by logic synthesis mechanism 204.

In some embodiments, logic synthesis mechanism 204 can be implemented by existing EDA software products, including Design Compiler®, Physical Compiler®, Test Compiler, Power Compiler™, FPGA Compiler, TetraMAX®, and DesignWare® from Synopsys, Inc.

During the physical implementation stage of the IC design flow, placement-and-routing mechanism 206 receives netlist 212 as input, and generates physical implementation 214. The modifications made to the logic topology of circuit design 208 by topology optimization mechanism 202 effectively increase the likelihood that placement-and-routing mechanism 206 can generate physical implementation 214 from netlist 212. In some embodiments, placement-and-routing mechanism 206 can be implemented by existing EDA software products, including Astro™ and IC Compiler products from Synopsys, Inc.

Sums of Products Logic Structures

A sum of products (SoP) logic structure is typically used to implement a Boolean expression that is in a disjunctive normal form. A minterm (i.e., a product in the Boolean expression) is typically implemented using a Boolean AND logic gate, and the minterms of the expression are typically combined into a disjunction using a number of Boolean OR logic gates. Some applications, including read-only-memory (ROM) devices, implement a number of large SoP logic structures, which are based on a common set of minterms (i.e., associative Boolean OR trees). If the associative Boolean OR logic trees do not implement a signal load structure which corresponds to a common ordering of minterms, the interconnections between the Boolean AND logic gates and the Boolean OR logic gates can cause routing congestion.

Figure 3A:
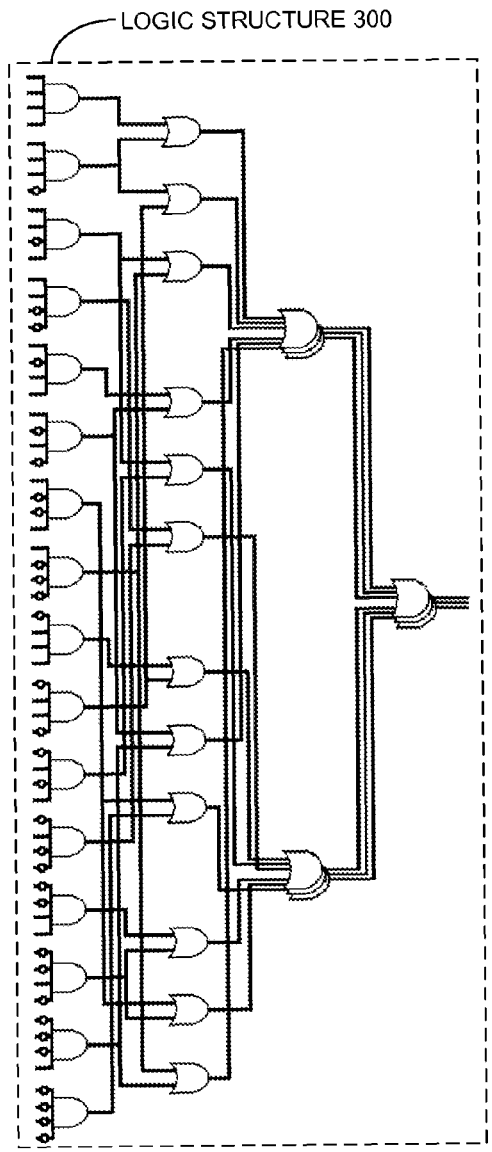
FIG. 3A illustrates a logic structure, for a number of associative SoP logic trees, which causes routing congestion in accordance with an embodiment of the present invention.

FIG. 3A illustrates a logic structure 300, for a number of associative SoP logic trees, which causes routing congestion in accordance with an embodiment of the present invention. Logic structure 300 includes three logic levels, where the first logic level includes a number of Boolean AND gates, and the second through fourth logic levels are implemented by a number of associative Boolean OR logic trees. More specifically, the set of interconnections between signal sources of the first logic level and the signal loads of the second logic level causes an undesirable number of crossovers, which causes routing congestion between the first and the second logic levels. Similarly, the set of interconnections between the signal sources of the second logic level and the signal loads of the third logic level causes an undesirable number of crossovers, which causes routing congestion between the second and the third logic levels.

The logic structure of the associative Boolean OR logic trees within logic structure 300 causes a type of routing congestion which cannot be alleviated by rearranging the placement of the logic cells. In other words, rearranging the Boolean AND logic gates and the Boolean OR logic gates will not reduce the number of crossovers. In some embodiments, the topology optimization mechanism optimizes associative SoP logic structures by constructing the associative Boolean OR logic trees for the logic structure based on a common ordering of minterms. To do so, the topology optimization mechanism can construct an SoP logic structure for a given Boolean logic expression which preserves a given ordering of a set of minterms.

Figure 3B:
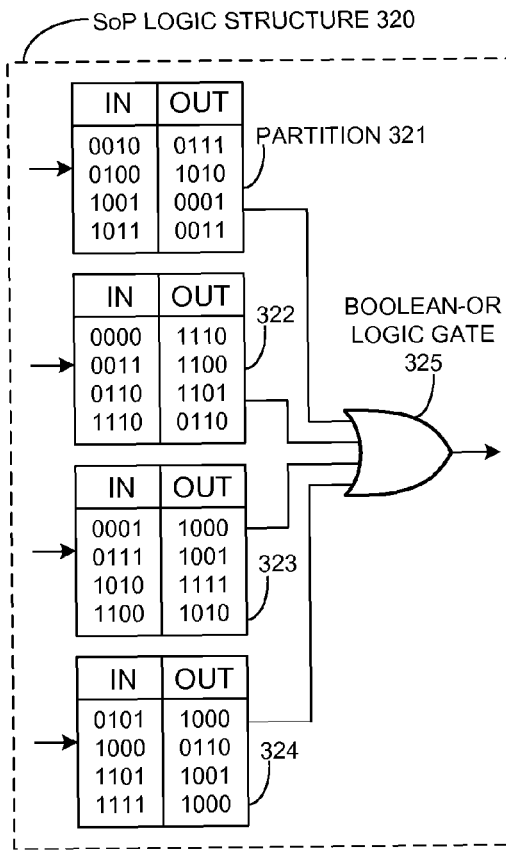
FIG. 3B illustrates a minterm table which is partitioned into an SoP logic structure in accordance with an embodiment of the present invention.

FIG. 3B illustrates a minterm table 310 which is partitioned into an SoP logic structure 320 in accordance with an embodiment of the present invention. In some embodiments, the topology optimization mechanism constructs SoP logic structure 320 by first partitioning a table of M minterms (e.g., minterm table 310) into at most P partitions (e.g., partitions 321-324), and generating an SoP logic structure for a respective partition. Then, the topology optimization mechanism completes the optimized SoP logic structure 320 by combining the SoP structures of partitions 321-324 using a Boolean OR logic gate 325. In some embodiments, a respective minterm partition of the P partitions is used to construct an SoP logic structure of M/P minterms, where the minterms of a first partition are disjoint from a second partition. In some embodiments, the order of the minterms in table 310 corresponds to the ordering of the minterms for a number of associative SoP logic structures.

Figure 3C:
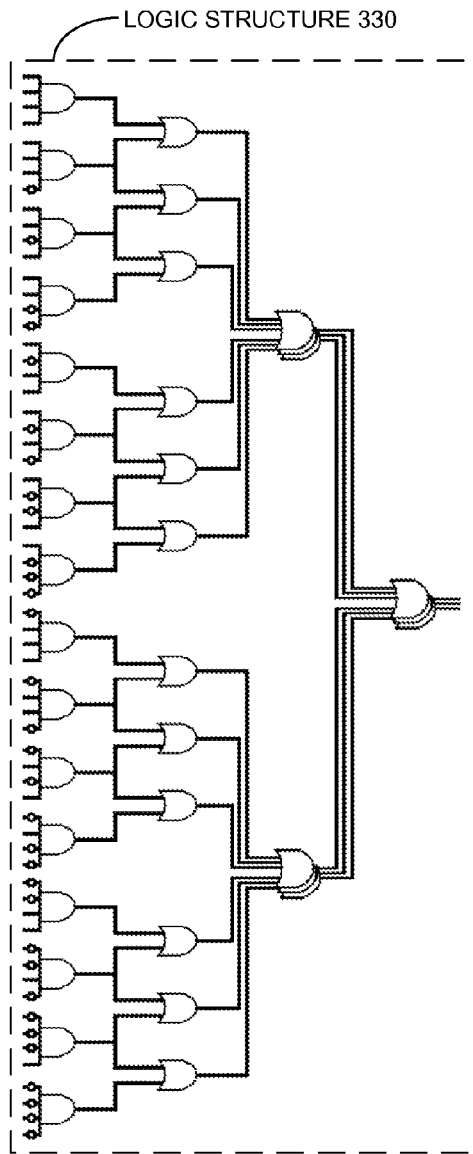
FIG. 3C illustrates a logic structure, for a number of associative SoP logic trees, which has been optimized to mitigate routing congestion in accordance with an embodiment of the present invention.

FIG. 3C illustrates a logic structure 330, for a number of associative SoP logic trees, which has been optimized to mitigate routing congestion in accordance with an embodiment of the present invention. Logic structure 330 includes three logic levels, where the first logic level includes a number of Boolean AND gates, and the second through fourth logic levels include a number of Boolean OR gates. More specifically, the set of interconnections between the signal sources of the first logic level and the signal loads of the second logic level minimizes the number of crossovers, which mitigates routing congestion between the first and the second logic levels. Similarly, the set of interconnections between the signal sources of the second logic level and the signal loads of the third logic level minimizes the number of crossovers, which mitigates routing congestion between the second and the third logic levels. Note that the number of crossovers in logic structure 330 is substantially reduced from the number of crossovers in logic structure 300 of FIG. 3A.

Figure 3D:
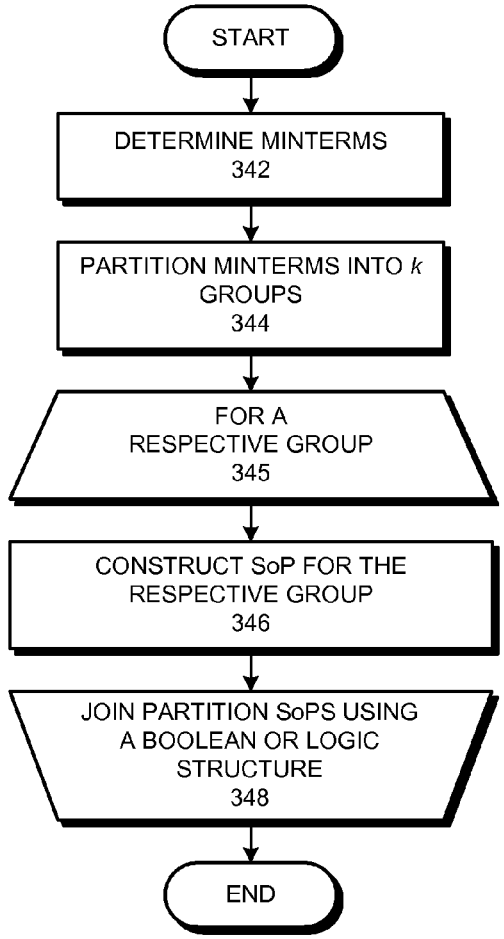
FIG. 3D illustrates a process for constructing an optimized SoP logic structure in accordance with an embodiment of the present invention.

FIG. 3D illustrates a process for constructing an optimized SoP logic structure in accordance with an embodiment of the present invention. The system begins by determining a table of minterms for the SoP logic structure (operation 342). Next, the system partitions the table of minterms into at most k groups (operation 344). Then, for a respective group (operation 345), the system constructs an SoP logic structure (operation 346). The system then joins the outputs from the SoP logic structures for the partitions using a Boolean OR logic structure (operation 348).

Parallel High-Fanout Buffer Tree

It is common for a number of nodes in an IC design to drive a common set of output loads. This load structure is known as a parallel high-fanout netlist. For these situations, a logic synthesis system may construct a number of parallel buffer trees to drive the output loads of the fanout nodes. If the buffer trees implement a structure which does not correspond to the ordering of the output loads, the interconnections between the outputs of the buffer tree and the output loads can cause routing congestion.

Figure 4A:
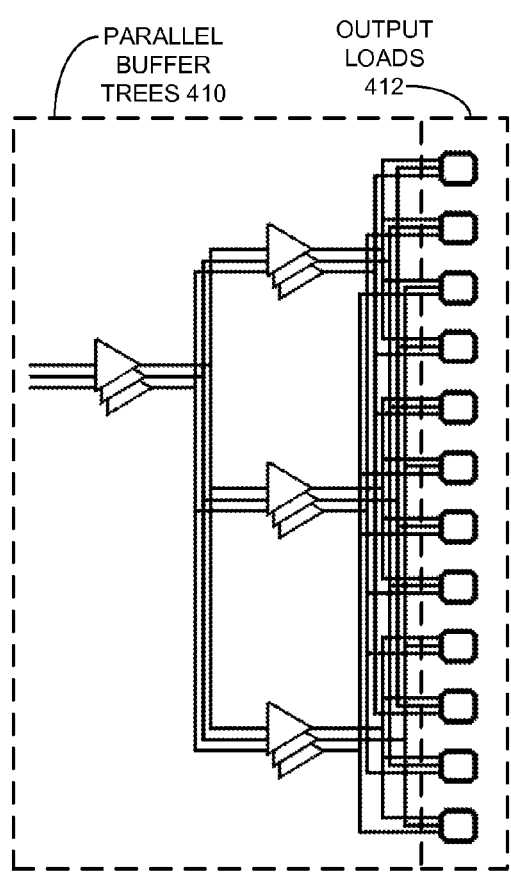
FIG. 4A illustrates a logic structure, for a number of parallel high-fanout buffer trees, which causes routing congestion in accordance with an embodiment of the present invention.

FIG. 4A illustrates a logic structure, for a number of parallel high-fanout buffer trees 410, which causes routing congestion in accordance with an embodiment of the present invention. Parallel buffer trees 410 drive a number of output loads 412. More specifically, the set of interconnections between the outputs for each buffer tree and the output loads 412 causes an undesirable number of crossovers, which causes routing congestion between parallel buffer trees 410 and output loads 412.

The buffer tree structure of the parallel buffer trees 410 causes a type of routing congestion which cannot be alleviated by rearranging the placement of the buffers or the placement of the output loads 412. Notice that, for the exemplary illustration of FIG. 4A, a respective buffer tree drives every node of output loads 412. In some embodiments, the topology optimization mechanism optimizes parallel high-fanout buffer trees by constructing them with a sequence of output nodes which match the placement sequence of output loads 412.

Figure 4B:
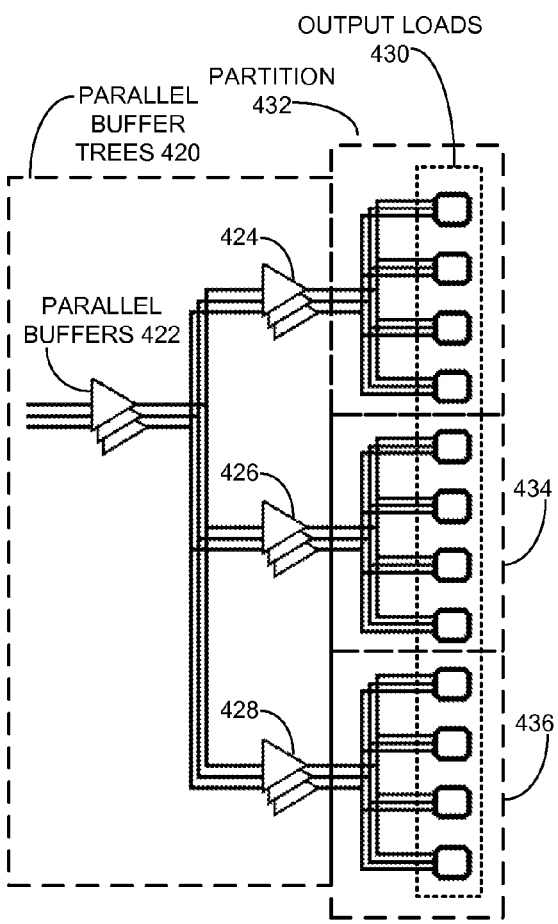
FIG. 4B illustrates a number of parallel buffer trees which have been optimized to mitigate routing congestion in accordance with an embodiment of the present invention.

FIG. 4B illustrates a number of parallel buffer trees 420 which have been optimized to mitigate routing congestion in accordance with an embodiment of the present invention. Parallel buffer trees 420 drive a number of output loads 430. More specifically, the set of interconnections between the outputs for each buffer tree and the output loads 430 minimizes the number of crossovers, which mitigates routing congestion between parallel buffer trees 420 and output loads 430. Note that the number of crossovers between parallel buffer trees 420 and output loads 430 is substantially lower than the number of crossovers between parallel buffer trees 410 and output loads 412 of FIG. 4A.

In some embodiments, the topology optimization mechanism constructs an optimized parallel buffer tree structure 420 by first partitioning a set of output loads into at most P partitions (e.g., partitions 432-436), and generating a set of parallel buffers for a respective partition (e.g., parallel buffers 424-428). Then, the topology optimization mechanism completes the optimized parallel buffer tree structure 420 by coupling the inputs to the sets of parallel buffers (e.g., parallel buffers 424-428) to a corresponding set of input sources. In some variations to these embodiments, the system can couple the inputs of a respective buffer (e.g., a buffer in parallel buffers 424) to the output of a corresponding input buffer (e.g., a corresponding buffer in parallel buffers 422), and couple the input of the corresponding input buffer to a corresponding input source.

Multiplexer Control Signal Buffering

A large multiplexer is typically implemented as a multiplexer tree, and control signals for the large multiplexer can have a high fanout onto the multiplexer tree. For these situations, a logic synthesis system may construct a buffer tree to drive the control signal loads of the multiplexer tree. If the buffer tree implements a signal source structure which does not correspond to the ordering of the control signal loads, the interconnections between the outputs of the buffer tree and the signal loads can cause an undesirable number of crossovers, which can cause routing congestion.

Figure 5A:
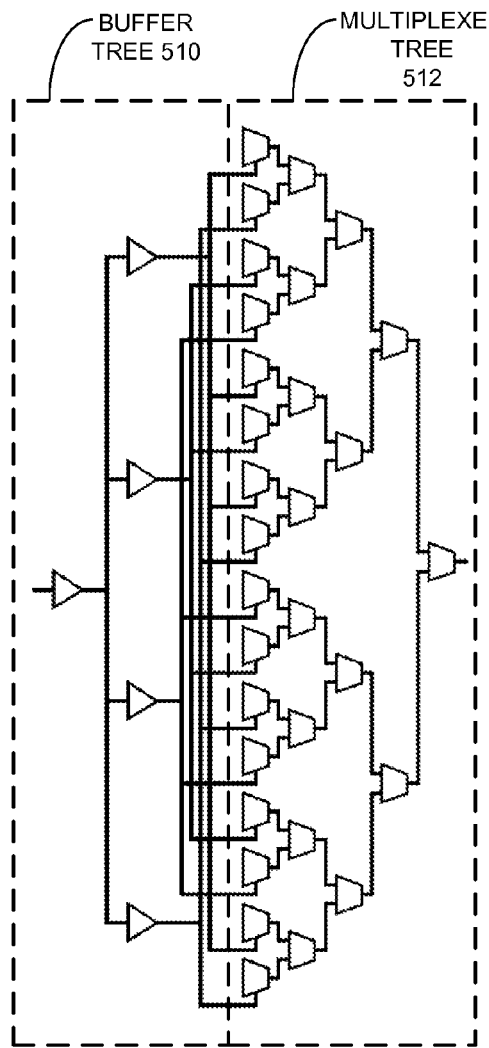
FIG. 5A illustrates routing congestion between a buffer tree and a multiplexer tree in accordance with an embodiment of the present invention.

FIG. 5A illustrates routing congestion between a buffer tree 510 and a multiplexer tree 512 in accordance with an embodiment of the present invention. More specifically, the set of interconnections between buffer tree 510 and the control signal loads of multiplexer tree 512 causes an undesirable number of crossovers between interconnections, which can cause routing congestion between buffer tree 510 and multiplexer tree 512.

The structure for buffer tree 510 causes a type of routing congestion which cannot be alleviated by rearranging the placement of the buffers or the placement of the individual multiplexers of multiplexer tree 512. In some embodiments, the topology optimization mechanism optimizes buffer trees by constructing them with a sequence of output nodes which match the ordering for the control signal loads of a target multiplexer tree.

Figure 5B:
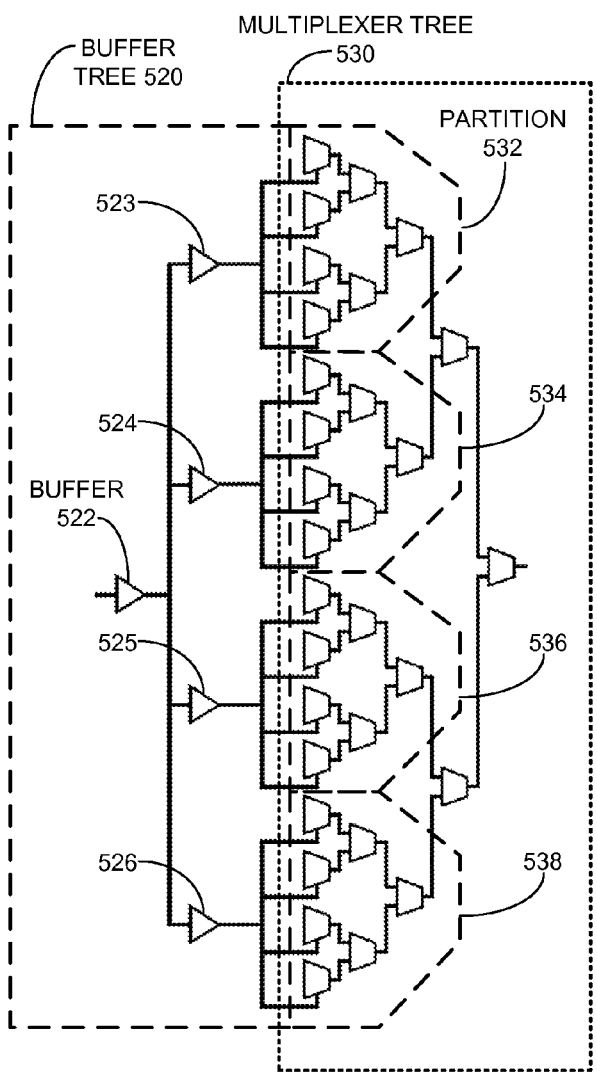
FIG. 5B illustrates a buffer tree which has been optimized to mitigate routing congestion in accordance with an embodiment of the present invention.

FIG. 5B illustrates a buffer tree 520 which has been optimized to mitigate routing congestion in accordance with an embodiment of the present invention. More specifically, the set of interconnections between buffer tree 520 and the control signal loads of multiplexer tree 530 minimizes the number of crossovers, which mitigates routing congestion between buffer tree 520 and multiplexer tree 530. Note that the number of crossovers between buffer tree 520 and multiplexer tree 530 is substantially lower than the number of crossovers between buffer tree 510 and multiplexer tree 512.

In some embodiments, the topology optimization mechanism constructs an optimized buffer tree 520 by first selecting l levels of logic of multiplexer tree 530, and partitioning the selected logic into at most P partitions (e.g., partitions 532-538) by performing a min-cut partitioning on the selected logic. Next, the topology optimization mechanism generates a buffer for a respective partition (e.g., partition 532), couples the output signal of the buffer to the signal loads of the partition (i.e., the control signals of the multiplexer tree), and completes the optimized buffer tree 520 by coupling the inputs to the set of buffers (e.g., buffers 523-526) to a control signal source. In some variations to these embodiments, the system can couple the inputs of a respective buffer (e.g., buffer 523) to the output of an input buffer (e.g., buffer 522), and couple the input of the input buffer to the control signal source.

Shared Logic Structures

Figure 6A:
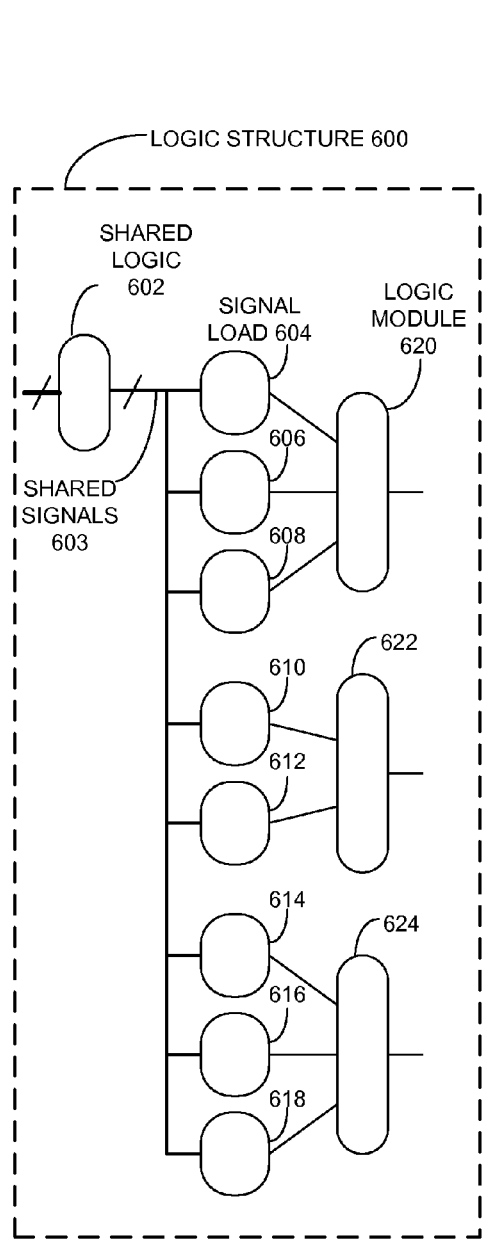
FIG. 6A illustrates a logic structure which shares logic over long distances in accordance with an embodiment of the present invention.

FIG. 6A illustrates a logic structure 600 which shares logic over long distances in accordance with an embodiment of the present invention. Shared logic 602 accepts few signals as input, and provides a relatively large number of signals as output (e.g., shared signals 603), which drive a number of signal loads (e.g., signal loads 604-618). More specifically, signal loads 604-618 may exist over long distances from shared logic 602, and it may not be possible to place signal loads 604-618 in a region of an IC's physical implementation that is local to shared logic 602, because they are associated with different logic modules (e.g., logic modules 620-624). This can cause routing congestion from the large number of interconnections from shared signals 603 which are routed across an IC's physical implementation between shared logic 602 and signal loads 604-618.

Shared signals 603, which couples shared logic 602 to signal loads 604-618, causes a type of routing congestion which cannot be alleviated by rearranging the placement of shared logic 602, because shared logic 602 may only be placed local to a subset of signal loads 604-618 on an IC's physical implementation. In some embodiments, the topology optimization mechanism optimizes shared logic structures by duplicating shared logic for groups of local signal loads (i.e., signal loads which can be placed within a predetermined distance from each other on an IC's physical implementation).

Figure 6B:
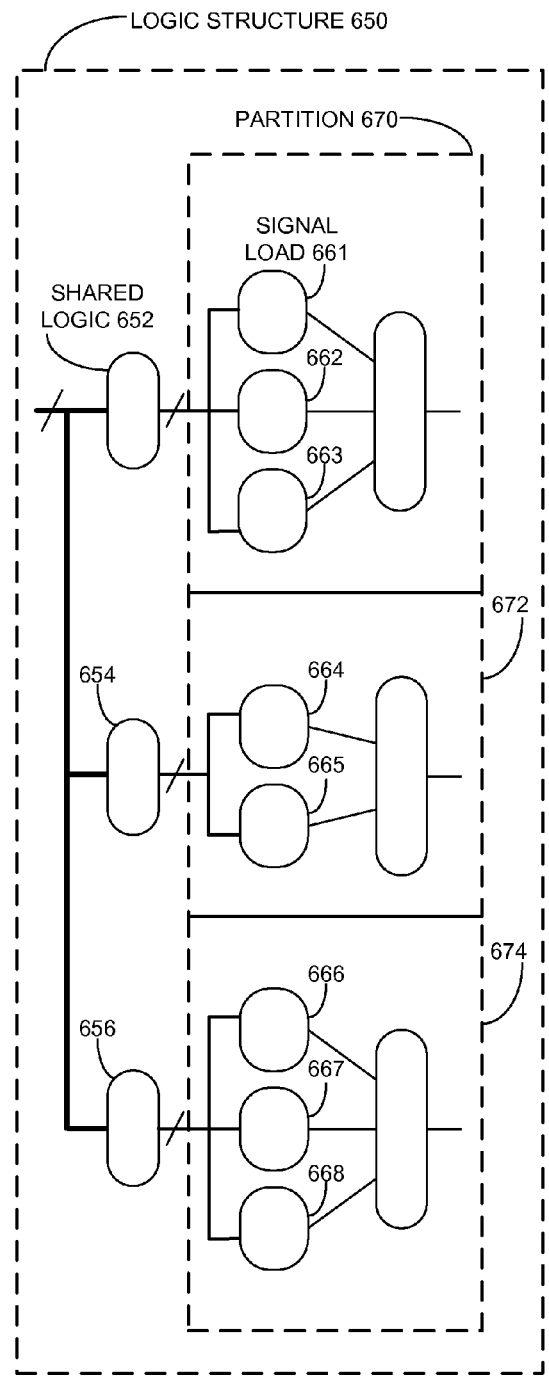
FIG. 6B illustrates a logic structure which shares logic over local regions to mitigate routing congestion in accordance with an embodiment of the present invention.

FIG. 6B illustrates a logic structure 650 which shares logic over local regions to mitigate routing congestion in accordance with an embodiment of the present invention. More specifically, an instance of the shared logic (e.g., shared logic 652) is created for a group of local signal loads (e.g., signal loads 661-663). This shared logic structure allows a circuit to achieve the benefits from sharing logic, without encountering the area overhead incurred from routing congestion.

In some embodiments, the topology optimization mechanism constructs an optimized shared logic structure 650 by first selecting l levels of logic of shared logic structure 650, and partitioning the selected logic into at most P partitions (e.g., partitions 670-674) by performing a min-cut partitioning on the selected logic. Then, the topology optimization mechanism generates an instantiation of the shared logic (e.g., shared logic 652) for a respective partition (e.g., partition 670), and couples the output signals of the instantiated shared logic to the signal loads (e.g., signal loads 661-663) of the respective partition.

Design-For-Test (DFT) Scan Chains

Figure 7A:
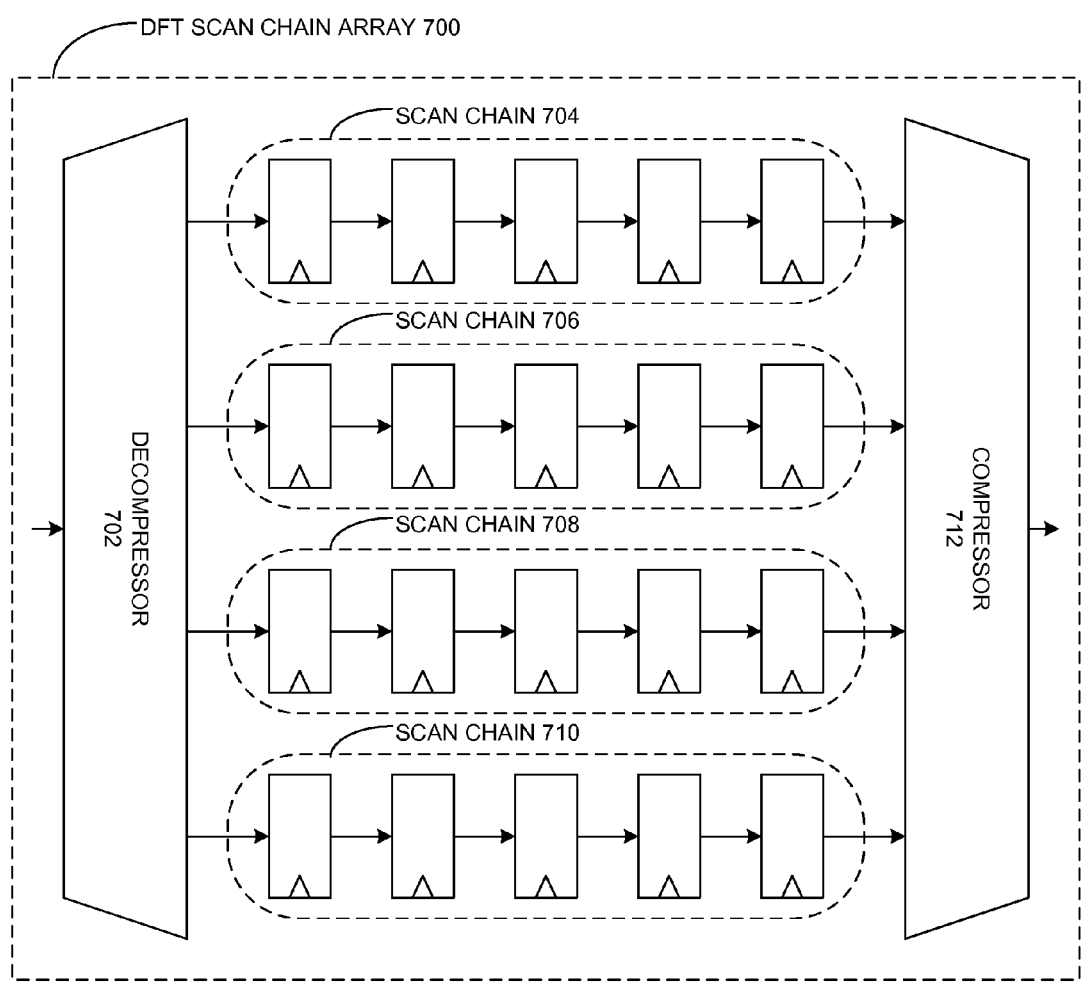
FIG. 7A illustrates a DFT scan chain array in accordance with an embodiment of the present invention.

FIG. 7A illustrates a DFT scan chain array 700 in accordance with an embodiment of the present invention. DFT scan chain array 700 includes a decompressor 702, a number of scan chains (e.g., scan chains 704-710), and a compressor 712. An ideal physical implementation for DFT scan chain array 700 minimizes the routing between decompressor 702 and compressor 712. In other words, the registers for a respective scan chain are placed and routed as a local group of registers, the scan chains are placed in close to proximity to each other, and the interconnection signals which couple the decompressor and the compressor to scan chains 706-710 should be minimal in length.

Figure 7B:
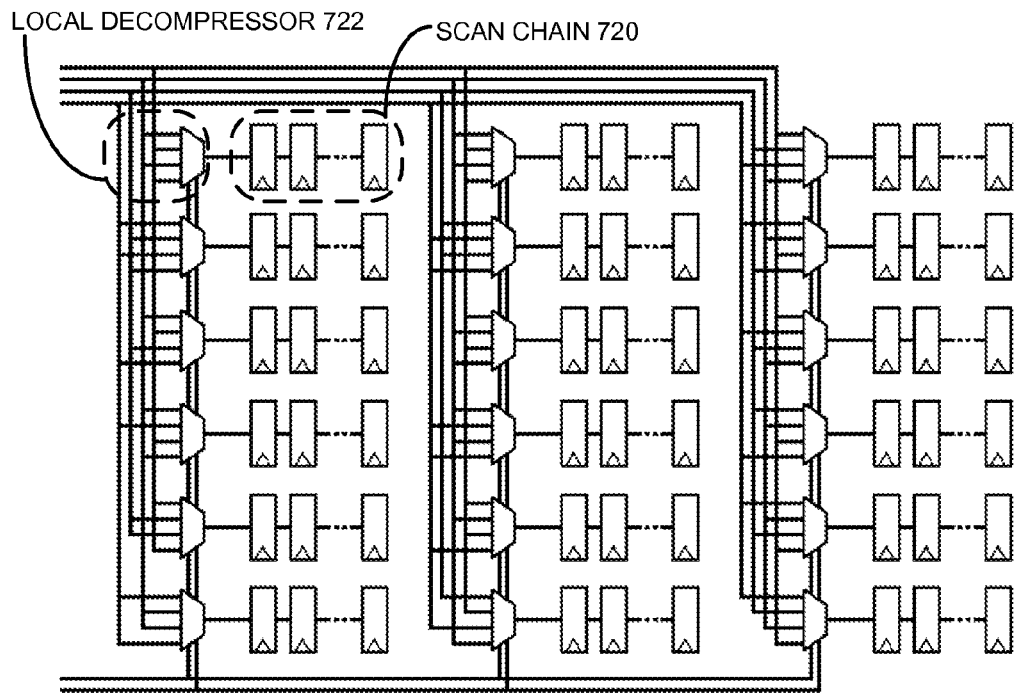
FIG. 7B illustrates an exemplary block-level implementation for a DFT decompressor for a number of scan chains in accordance with an embodiment of the present invention.

FIG. 7B illustrates an exemplary block-level implementation for a DFT decompressor for a number of scan chains in accordance with an embodiment of the present invention. This exemplary implementation for a DFT decompressor includes a number of local decompressors (e.g., local decompressor 722), which are associated with a corresponding scan chain (e.g., scan chain 720). In other words, the DFT decompressor is implemented as a distributed collection of local decompressors. Furthermore, the output signal for a local decompressor drives the input signal for a corresponding scan chain. This implementation for a DFT decompressor based on distributed decompressors allows for the interconnections between the DFT decompressor and the scan chains to be minimal in length.

Figure 7C:
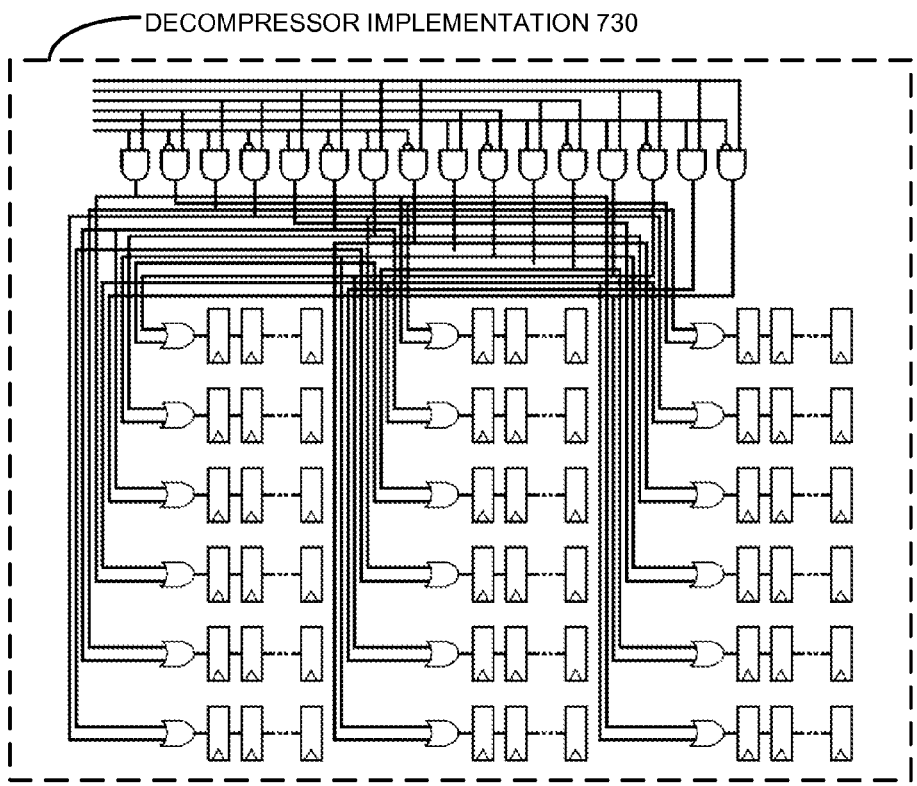
FIG. 7C illustrates a possible implementation for a DFT decompressor which performs logic sharing over long distances in accordance with an embodiment of the present invention.

FIG. 7C illustrates a possible implementation for a DFT decompressor which performs logic sharing over long distances in accordance with an embodiment of the present invention. DFT decompressor implementation 730 is the result of a logic synthesis operation attempting to minimize the number of logic gates used for the DFT decompressor, and includes a set of Boolean AND logic gates which implement the minterms for the distributed set of local decompressors. Note that the set of interconnections between the output signals for the Boolean AND logic gates and the Boolean OR logic gates causes an undesirable number of signal sources which are shared across a distributed set of signal loads, which can cause routing congestion between the Boolean AND logic gates and the Boolean OR logic gates. In some embodiments, the topology optimization mechanism optimizes the implementation for the distributed set of local decompressors by restricting logic sharing to pairs of scan chains which are in close proximity to each other.

Figure 7D:
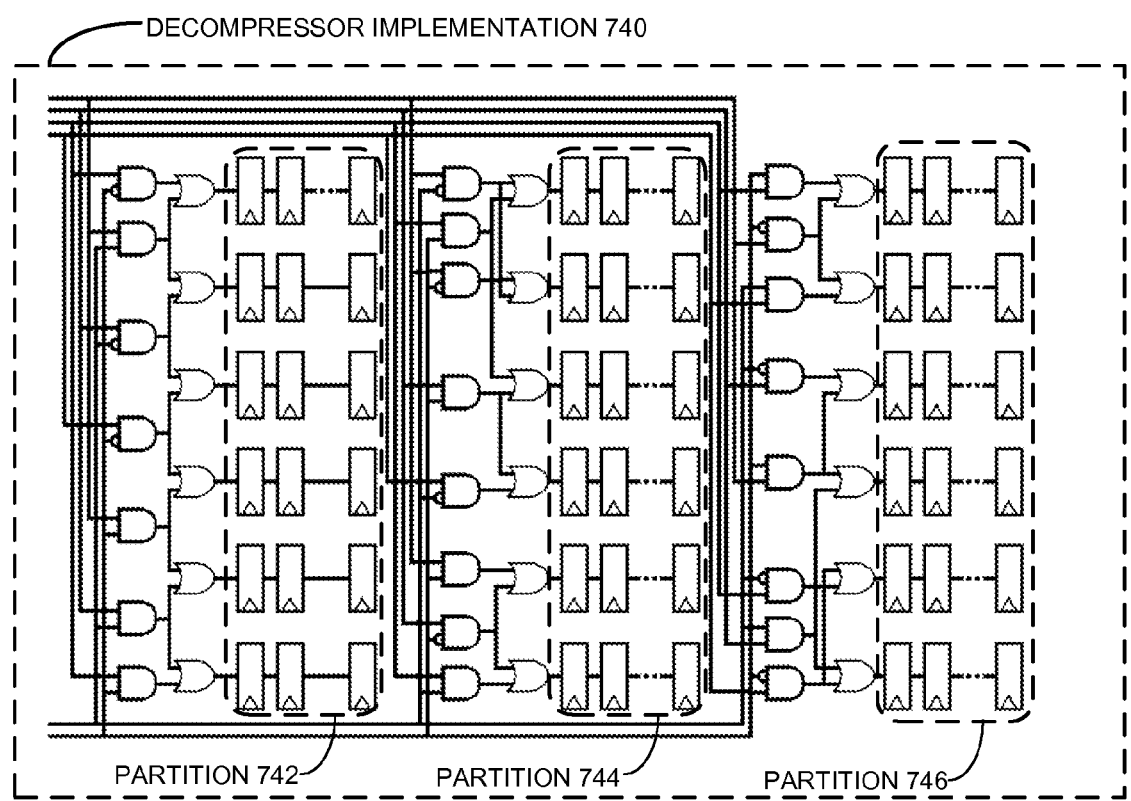
FIG. 7D illustrates an exemplary implementation for a DFT decompressor which mitigates routing congestion in accordance with an embodiment of the present invention.

FIG. 7D illustrates an exemplary implementation for a DFT decompressor which mitigates routing congestion in accordance with an embodiment of the present invention. The topology optimization mechanism achieves a local sharing of logic by limiting the pairs of scan chains which can share logic to those pairs of scan chains which are within a predetermined proximity to each other. In one embodiment, DFT decompressor implementation 740 is constructed by partitioning the scan chains into P partitions, and generating a local implementation of the DFT decompressor for a respective scan chain in a partition $P_i$ by sharing logic with local DFT decompressor implementations for other scan chains in partition $P_i$. When optimizing the implementation for decompressor implementation 740, topology optimization mechanism can allow scan chains in partition 742 to share logic, can allow scan chains in partition 744 to share logic, and can allow scan chains in partition 746 to share logic. Note that the number of signal sources which are shared across a distributed set of signal loads in decompressor implementation 740 is substantially lower than in decompressor implementation 730 of FIG. 7C.

Figure 7E:
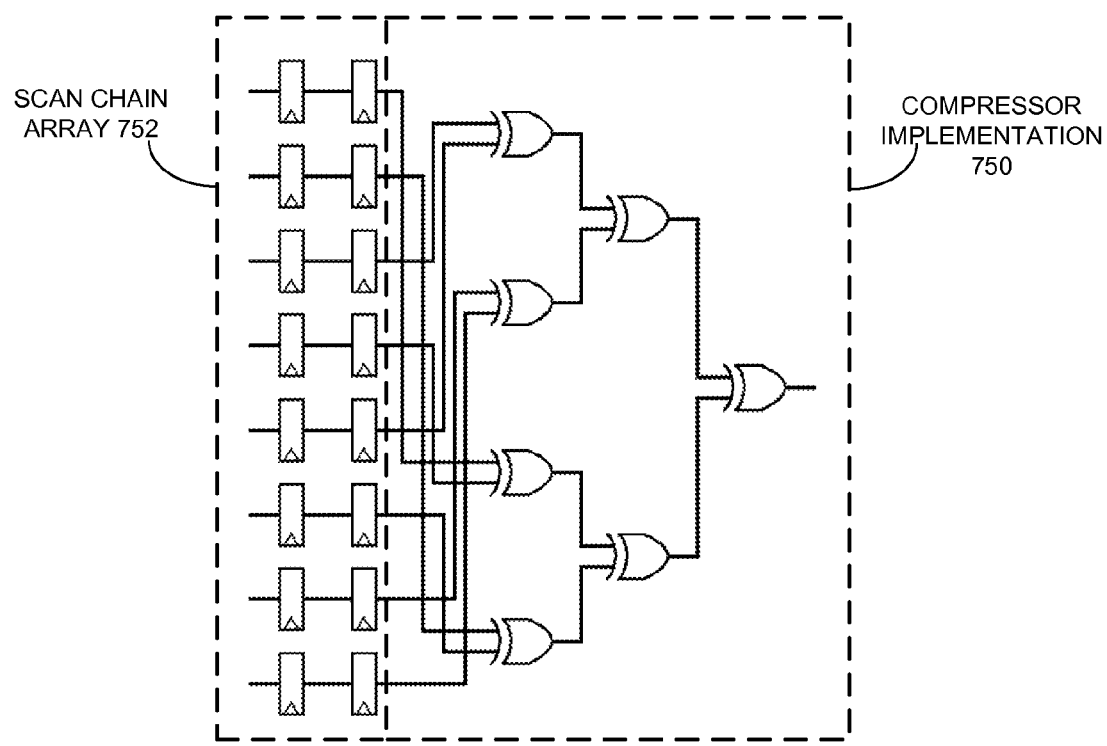
FIG. 7E illustrates routing congestion between a DFT compressor implementation and a scan chain array in accordance with an embodiment of the present invention.

FIG. 7E illustrates routing congestion between a DFT compressor implementation 750 and a scan chain array 752 in accordance with an embodiment of the present invention. DFT compressor implementation 750 includes a number of exclusive-OR logic gates which implement an exclusive-OR tree structure, where an input signal of an exclusive-OR logic gate is coupled to an output signal of a scan chain array. More specifically, the set of interconnections between the input signals for DFT compressor implementation 750 and the output signals of scan chain array 752 causes an undesirable number of crossovers, which can cause routing congestion between DFT compressor implementation 750 and scan chain array 752.

The structure for DFT compressor implementation 750 causes a type of routing congestion which cannot be alleviated by rearranging the placement of the exclusive-OR logic gates, or the ordering of the scan chains in scan chain array 752. Furthermore, it would not be desirable to rearrange the ordering of the scan chains in scan chain array 752, because doing so could cause an existing implementation for the DFT decompressor implementation to share logic over distances which are longer than a desired distance. In some embodiments, the topology optimization mechanism optimizes DFT compressor implementation 750 by reconstructing the exclusive-OR logic tree with a sequence of input nodes which match the ordering of the output signals of scan chain array 752.

Figure 7F:
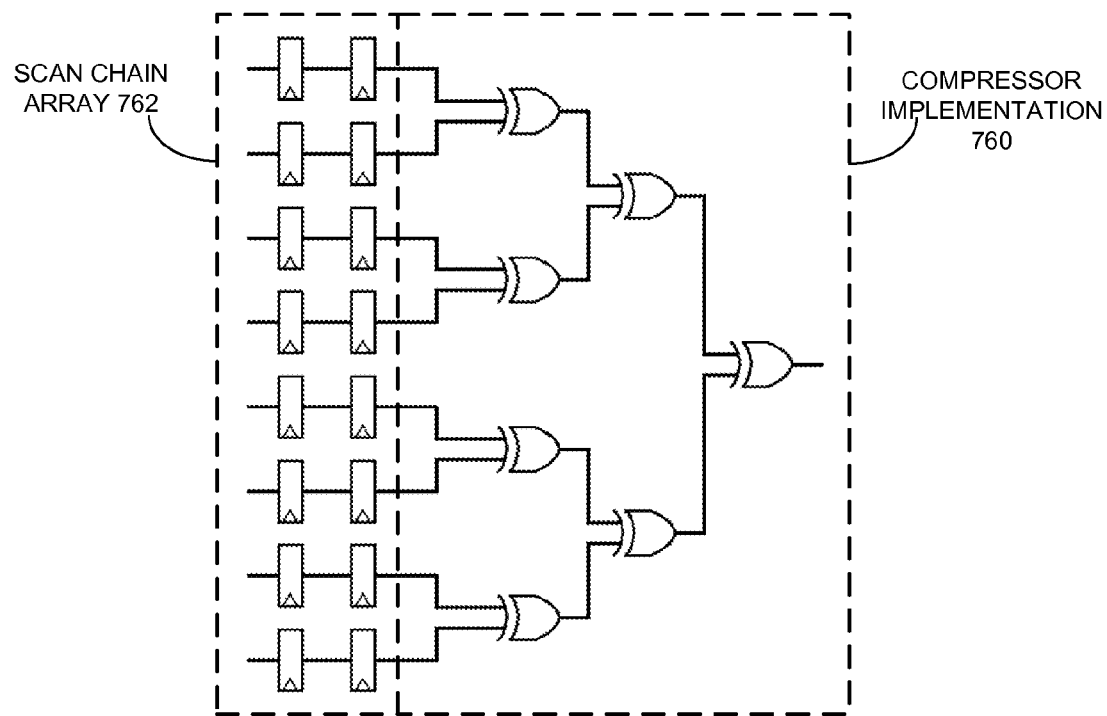
FIG. 7F illustrates an exemplary implementation for a DFT compressor which has been optimized to mitigate routing congestion in accordance with an embodiment of the present invention.

FIG. 7F illustrates an exemplary implementation for a DFT compressor which has been optimized to mitigate routing congestion in accordance with an embodiment of the present invention. DFT compressor implementation 760 includes a number of exclusive-OR logic gates which implement an exclusive-OR tree structure, where an input signal of an exclusive-OR logic gate is coupled to an output signal of a scan chain array. More specifically, the set of interconnections between the input signals for DFT compressor implementation 760 and the output signals of scan chain array 762 minimizes the number of crossovers, which mitigates routing congestion between DFT compressor implementation 760 and scan chain array 762. Note that the number of crossovers between scan chain array 762 and compressor implementation 760 is substantially lower than the number of crossovers between scan chain array 752 and compressor implementation 750 of FIG. 7E.

In some embodiments, the topology optimization mechanism constructs an optimized DFT compressor implementation 760 by determining a placement sequence for the set of scan chains in scan chain array 752, and constructing the exclusive-OR logic tree for the DFT compressor using an ordering of the output signals from the scan chain array which matches the ordering of the input signals of the exclusive-OR logic tree. In other words, the topology optimization mechanism constructs an optimized DFT compressor implementation 760 where a given input logic gate of the exclusive-OR logic tree is an output load to a pair of neighboring DFT scan chains.

Multiplexer and Read-Only-Memory (ROM) Structures

Figure 8A:
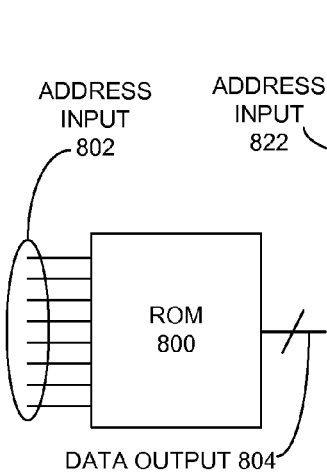
FIG. 8A illustrates a ROM in accordance with an embodiment of the present invention.

FIG. 8A illustrates a ROM 800 in accordance with an embodiment of the present invention. ROM 800 can potentially be synthesized into a circuit structure which can cause routing congestion as a result of logic sharing. More specifically, ROM 800 may be implemented using a multitude of associative SoP logic structures, where a given output of ROM 800 is implemented by a corresponding SoP logic structure. This can cause routing congestion as illustrated in FIG. 3A, and described in the corresponding paragraphs. In some embodiments, the topology optimization mechanism optimizes the implementation for ROM 800 by using a Shannon decomposition to partition ROM 800 into $P=2^k$ smaller ROMs, where k is a positive integer. In some variations on these embodiments, the topology optimization mechanism partitions ROM 800 into four smaller ROMs.

Figure 8B:
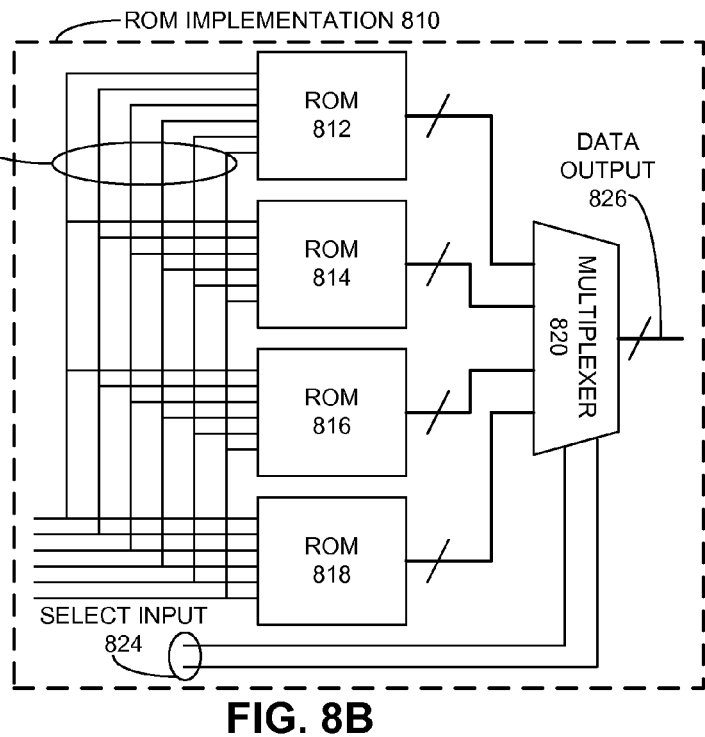
FIG. 8B illustrates an exemplary ROM implementation which mitigates routing congestion in accordance with an embodiment of the present invention.

FIG. 8B illustrates an exemplary ROM implementation 810 which mitigates routing congestion in accordance with an embodiment of the present invention. More specifically, the partitioned structure of ROM implementation 810 imposes a hierarchical structure which prevents the logic synthesis mechanism from implementing logic sharing between ROM partitions, thereby mitigating routing congestion.

ROM implementation 810 includes $P=2^k$ ROMs (e.g., ROMs 812-818), and a P-way multiplexer 820. An output from a respective ROM (e.g., ROM 812) is coupled to a corresponding input port of multiplexer 820, and multiplexer 820 produces a data output 826 which corresponds to data output 804 of ROM 800. In some embodiments, the address input 822 for ROMs 812-818 is coupled to the most-significant N-k bits of an N-bit address vector, and select input 824 of multiplexer 820 is coupled to the least-significant k bits of the N-bit address vector. In other embodiments, the address input 822 for ROMs 812-818 is coupled to the least-significant N-k bits of an N-bit address vector, and select input 824 of multiplexer 820 is coupled to the most-significant k bits of the N-bit address vector.

Figure 9A:
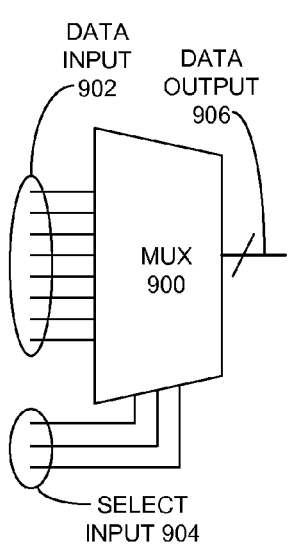
FIG. 9A illustrates a multiplexer in accordance with an embodiment of the present invention.

FIG. 9A illustrates a multiplexer 900 in accordance with an embodiment of the present invention. Multiplexer 900 includes an M-bit data input 902, and an N-bit select input 904. Multiplexer 900 can potentially be synthesized into a circuit structure which can cause routing congestion as a result of logic sharing. More specifically, multiplexer 900 may be implemented using a high-fanout buffer tree, which can cause routing congestion as illustrated in FIG. 5A, and described in the corresponding paragraphs. In some embodiments, the topology optimization mechanism optimizes the implementation for multiplexer 900 by partitioning multiplexer 900 into $P=2^k$ smaller multiplexers, where k is a positive integer. In some variations on these embodiments, the topology optimization mechanism partitions multiplexer 900 into four smaller multiplexers.

Figure 9B:
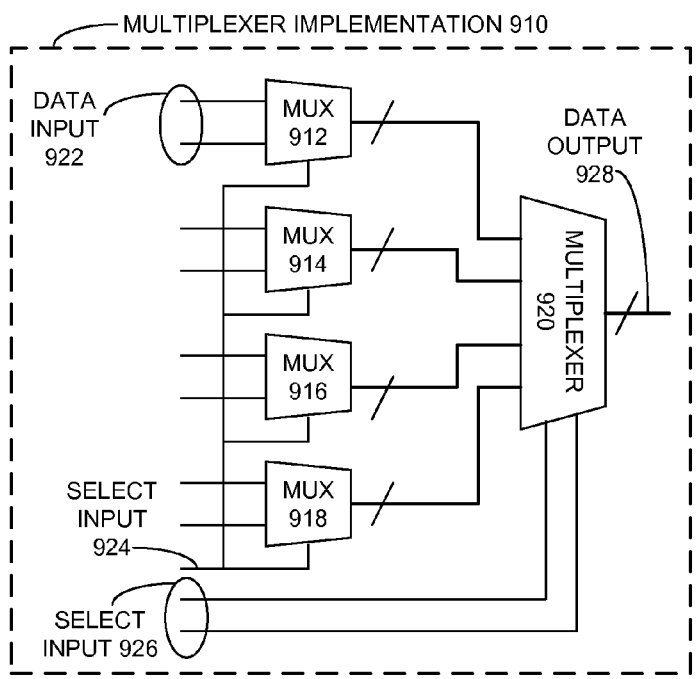
FIG. 9B illustrates an exemplary multiplexer implementation which mitigates routing congestion in accordance with an embodiment of the present invention.

FIG. 9B illustrates an exemplary multiplexer implementation 910 which mitigates routing congestion in accordance with an embodiment of the present invention. More specifically, the partitioned structure of multiplexer implementation 910 imposes a hierarchical structure which prevents the logic synthesis mechanism from implementing high-fanout buffer trees, thereby mitigating routing congestion.

Multiplexer implementation 910 includes $P=2^k$ multiplexer partitions (e.g., multiplexers 912-918), and a P-way output multiplexer 920. An M-bit data vector (e.g., data inputs 902) is partitioned into P sets of data input bits, where a given set (e.g., data inputs 922) is coupled to input ports for a corresponding multiplexer partition (e.g., multiplexer 912). Furthermore, an output from a respective multiplexer partition is coupled to a corresponding input port of multiplexer 920, and multiplexer 920 produces a data output 928 which corresponds to data output 906 of multiplexer 900. In some embodiments, select input 924 for multiplexers 912-918 is coupled to the most-significant N-k bits of select input 904, and select input 926 of multiplexer 920 is coupled to the least-significant k bits of select input 904. In other embodiments, select input 924 for multiplexers 912-918 is coupled to the least-significant N-k bits of select input 904, and select input 926 of multiplexer 920 is coupled to the most-significant k bits of select input 904.

Computer System

Figure 10:
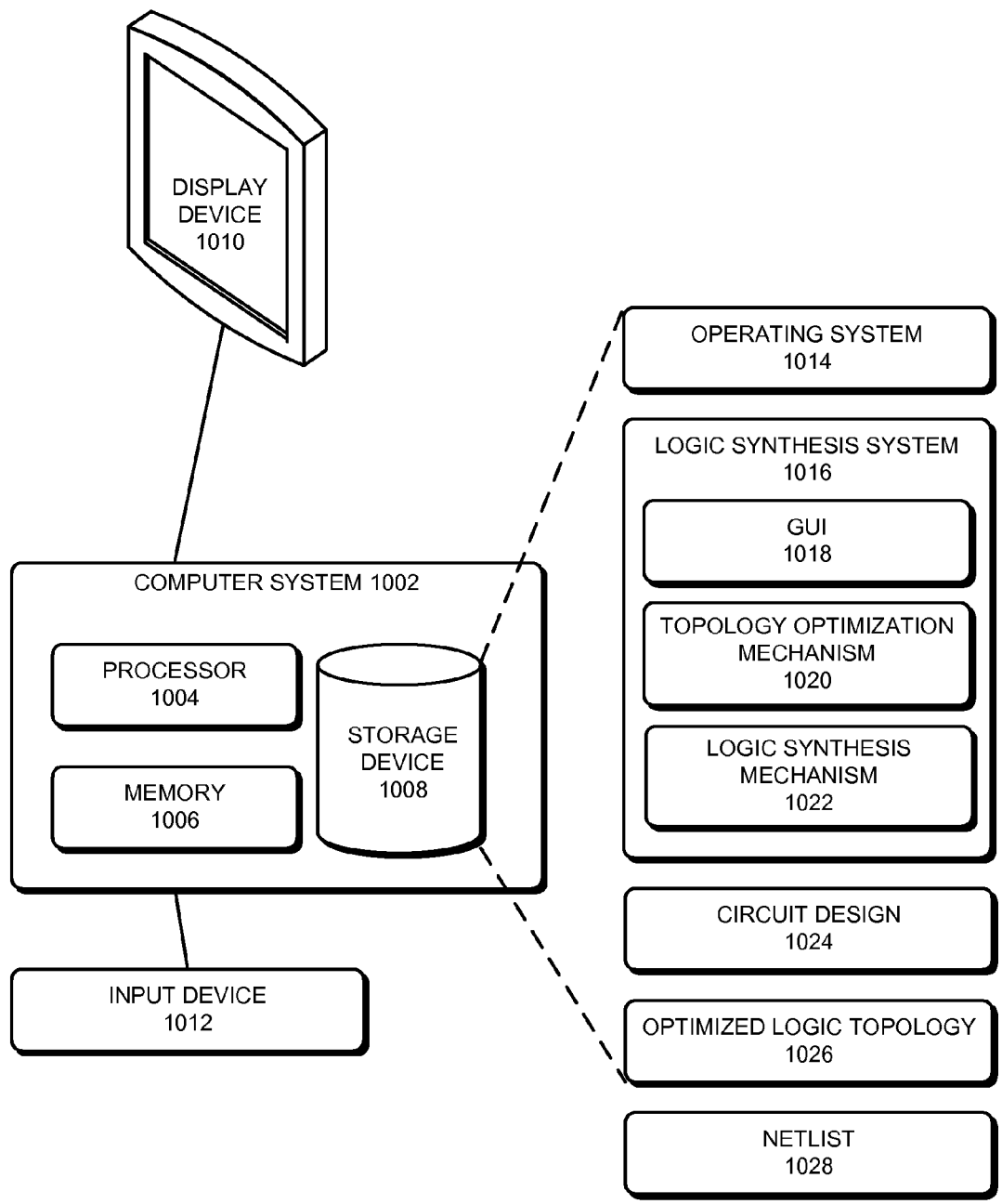
FIG. 10 illustrates an exemplary computer system that facilitates optimizing a circuit design during a logic design stage to reduce routing congestion during a placement and routing stage in accordance with an embodiment of the present invention.

FIG. 10 illustrates an exemplary computer system 1002 that facilitates optimizing a circuit design during a logic design stage to reduce routing congestion during a placement and routing stage in accordance with an embodiment of the present invention. Computer system 1002 includes a processor 1004, a memory 1006, and a storage device 1008. Furthermore, computer system 1002 can be coupled to a display device 1010 and an input device 1012.

Storage device 1008 stores an operating system 1014, a logic synthesis system 1016, an optimized logic topology 1026, and a netlist 1028. Logic synthesis system 1016 includes a graphical user interface (GUI) 1018, a topology optimization mechanism 1020, and a logic synthesis mechanism 1022.

During operation, logic synthesis system 1016 is loaded from storage device 1008 into memory 1006 and is executed by processor 1004. Logic synthesis system 1016 takes a circuit design 1024 as input, and uses topology optimization mechanism 1020 and logic synthesis mechanism 1022 to generate netlist 1028, which can mitigate routing congestion during the placement and routing stage.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for optimizing a circuit design during a logic synthesis stage to reduce routing congestion during a placement and routing stage, comprising:

identifying a first circuit structure in the circuit design, wherein the first circuit structure includes a first set of interconnections between a first set of signal sources and a first set of signal loads, wherein the first set of interconnections causes a first number of crossovers in the first circuit structure, and wherein the first number of crossovers are expected to cause routing congestion during the placement and routing stage;

generating a second circuit structure which is functionally equivalent to the first circuit structure, wherein the second circuit structure includes a second set of interconnections between a second set of signal sources and a second set of signal loads, wherein the second set of interconnections causes a second number of crossovers in the second circuit structure which is substantially less than the first number of crossovers; and replacing, by computer, the first circuit structure in the circuit design with the second circuit structure, thereby substantially reducing crossovers in the circuit design, which, in turn, reduces routing congestion during the placement and routing stage.

2. The method of claim 1, wherein identifying the first circuit structure in the circuit design comprises determining whether the first circuit structure implements a set of sums-of-products expressions, wherein the set of sums-of-products expressions are associated with a common set of M minterms, and wherein a respective sum-of-products expression is a disjunction of at most M minterms; and
wherein generating the second circuit structure comprises:
determining an ordering for the set of M minterms;
generating a minterm table for a respective sum-of-products expression, wherein the minterm table comprises the set of minterms associated with the respective sum-of-products expression;
partitioning the minterm table into P table partitions, wherein the minterms of a first partition are disjoint from a second partition;
generating a sum-of-products circuit structure for a respective table partition; and
generating a Boolean OR logic structure for the respective sum-of-products expression, wherein the Boolean OR logic structure combines the outputs from the sum-of-products circuit structures of the P table partitions.

3. The method of claim 1, wherein identifying the first circuit structure in the circuit design comprises determining whether the first circuit structure comprises at least M signal loads for one or more signal sources; and
wherein generating the second circuit structure comprises:
selecting l levels of logic associated with the M signal loads;
partitioning the selected logic into at most P partitions by performing a min-cut partitioning on the selected logic; and
for a respective signal source:
coupling the input signals of a respective partition to the output of a corresponding buffer; and
coupling the input of the corresponding buffer to the respective signal source.

4. The method of claim 1, wherein identifying the first circuit structure in the circuit design comprises determining whether the first circuit structure implements a read-only-memory (ROM), wherein the ROM has an M-bit address input; and
wherein generating the second circuit structure comprises:
partitioning the first circuit structure into at most $P=2^k$ partitions, wherein a respective partition has an address input of M-k bits; and
coupling the output signals of a respective partition to a corresponding entry of a P-way multiplexer, wherein the P-way multiplexer has a select input of k bits.

5. The method of claim 1, wherein identifying the first circuit structure in the circuit design comprises determining whether the first circuit structure is a multiplexer, wherein the multiplexer has at most $N=2^M$ input signal sources, and has a select input of M bits; and
wherein generating the second circuit structure comprises:
partitioning the first circuit structure into at most $P=2^k$ partitions, wherein a respective partition has a select input of M-k bits; and
coupling the output signals of a respective partition to a corresponding entry of a P-way multiplexer, wherein the P-way multiplexer has a select input of k bits.

6. The method of claim 1, wherein identifying the first circuit structure in the circuit design comprises determining whether the circuit structure is shared by at least M signal loads; and
wherein generating the second circuit structure comprises:
selecting l levels of logic associated with the M signal loads;
partitioning the selected logic into at most P partitions by performing a min-cut partitioning on the selected logic; and
producing an instantiation of the first circuit structure for a respective partition of the signal loads.

7. The method of claim 1, wherein identifying the first circuit structure in the circuit design comprises:
determining whether the first circuit structure implements a decompression logic for M design-for-test (DFT) scan chains, wherein the decompression logic produces a set of output signals, wherein a respective output signal drives a corresponding DFT scan chain, and wherein a respective DFT scan chain is implemented by a register chain; and
wherein generating the second circuit structure comprises:
partitioning the M scan chains into P partitions of scan chains; and
generating a local implementation of the DFT decompressor for a respective DFT scan chain in a partition $P_i$ by sharing logic with local DFT decompressor implementations for other scan chains in partition $P_i$.

8. The method of claim 1, wherein identifying the first circuit structure in the circuit design comprises:
determining whether the first circuit structure implements a compression logic for M design-for-test (DFT) scan chains, wherein a respective DFT scan chain is implemented by a register chain, wherein the compression logic comprises M input signal loads, and wherein the compression logic produces a compressed signal output for the M DFT scan chains; and
wherein generating the second circuit structure comprises:
determining an ordering for the M DFT scan chains based on their placement sequence;
determining an ordering for the M signal loads of the compression logic based on their placement sequence; and
coupling the output signals of the M DFT scan chains to the M input signal loads of the compression logic based on their corresponding orderings.

9. A non-transitory computer-readable storage medium storing instructions that when executed by a computer cause the computer to perform a method for optimizing a circuit design during a logic synthesis stage to reduce routing congestion during a placement and routing stage, the method comprising:
identifying a first circuit structure in the circuit design, wherein the first circuit structure includes a first set of interconnections between a first set of signal sources and a first set of signal loads, wherein the first set of interconnections causes a first number of crossovers in the first circuit structure, and wherein the first number of crossovers are expected to cause routing congestion during the placement and routing stage;
generating a second circuit structure which is functionally equivalent to the first circuit structure, wherein the second circuit structure includes a second set of interconnections between a second set of signal sources and a second set of signal loads, wherein the second set of interconnections causes a second number of crossovers in the second circuit structure which is substantially less than the first number of crossovers; and replacing the first circuit structure in the circuit design with the second circuit structure, thereby substantially reducing crossovers in the circuit design, which, in turn, reduces routing congestion during the placement and routing stage.

10. The computer-readable storage medium of claim 9, wherein identifying the first circuit structure in the circuit design comprises determining whether the first circuit structure implements a set of sums-of-products expressions, wherein the set of sums-of-products expressions are associated with a common set of M minterms, and wherein a respective sum-of-products expression is a disjunction of at most M minterms; and wherein generating the second circuit structure comprises:
determining an ordering for the set of M minterms;
generating a minterm table for a respective sum-of-products expression, wherein the minterm table comprises the set of minterms associated with the respective sum-of-products expression;
partitioning the minterm table into P table partitions, wherein the minterms of a first partition are disjoint from a second partition;
generating a sum-of-products circuit structure for a respective table partition; and
generating a Boolean OR logic structure for the respective sum-of-products expression, wherein the Boolean OR logic structure combines the outputs from the sum-of-products circuit structures of the P table partitions.

11. The computer-readable storage medium of claim 9, wherein identifying the first circuit structure in the circuit design comprises determining whether the first circuit structure comprises at least M signal loads for one or more signal sources; and wherein generating the second circuit structure comprises:
selecting l levels of logic associated with the M signal loads;
partitioning the selected logic into at most P partitions by performing a min-cut partitioning on the selected logic; and
for a respective signal source:
coupling the input signals of a respective partition to the output of a corresponding buffer; and
coupling the input of the corresponding buffer to the respective signal source.

12. The computer-readable storage medium of claim 9, wherein identifying the first circuit structure in the circuit design comprises determining whether the first circuit structure implements a read-only-memory (ROM), wherein the ROM has an M-bit address input; and wherein generating the second circuit structure comprises:
partitioning the first circuit structure into at most $P=2^k$ partitions, wherein a respective partition has an address input of M-k bits; and
coupling the output signals of a respective partition to a corresponding entry of a P-way multiplexer, wherein the P-way multiplexer has a select input of k bits.

13. The computer-readable storage medium of claim 9, wherein identifying the first circuit structure in the circuit design comprises determining whether the first circuit structure is a multiplexer, wherein the multiplexer has at most $N=2^M$ input signal sources, and has a select input of M bits; and wherein generating the second circuit structure comprises:
partitioning the first circuit structure into at most $P=2^k$ partitions, wherein a respective partition has a select input of M-k bits; and
coupling the output signals of a respective partition to a corresponding entry of a P-way multiplexer, wherein the P-way multiplexer has a select input of k bits.

14. The computer-readable storage medium of claim 9, wherein identifying the first circuit structure in the circuit design comprises determining whether the circuit structure is shared by at least M signal loads; and wherein generating the second circuit structure comprises:
selecting l levels of logic associated with the M signal loads;
partitioning the selected logic into at most P partitions by performing a min-cut partitioning on the selected logic; and
producing an instantiation of the first circuit structure for a respective partition of the signal loads.

15. The computer-readable storage medium of claim 9, wherein identifying the first circuit structure in the circuit design comprises:
determining whether the first circuit structure implements a decompression logic for M design-for-test (DFT) scan chains, wherein the decompression logic produces a set of output signals, wherein a respective output signal drives a corresponding DFT scan chain, and wherein a respective DFT scan chain is implemented by a register chain; and
wherein generating the second circuit structure comprises:
partitioning the M scan chains into P partitions of scan chains; and
generating a local implementation of the DFT decompressor for a respective DFT scan chain in a partition $P_i$ by sharing logic with local DFT decompressor implementations for other scan chains in partition $P_i$.

16. The computer-readable storage medium of claim 9, wherein identifying the first circuit structure in the circuit design comprises:
determining whether the first circuit structure implements a compression logic for M design-for-test (DFT) scan chains, wherein a respective DFT scan chain is implemented by a register chain, wherein the compression logic comprises M input signal loads, and wherein the compression logic produces a compressed signal output for the M DFT scan chains; and
wherein generating the second circuit structure comprises:
determining an ordering for the M DFT scan chains based on their placement sequence;
determining an ordering for the M signal loads of the compression logic based on their placement sequence; and
coupling the output signals of the M DFT scan chains to the M input signal loads of the compression logic based on their corresponding orderings.

17. A computer system for optimizing a circuit design during a logic synthesis stage to reduce routing congestion during a placement and routing stage, comprising:
a processor; and
a non-transitory computer-readable storage medium storing instructions that when executed by the processor cause the computer system to:
identify a first circuit structure in the circuit design, wherein the first circuit structure includes a first set of interconnections between a first set of signal sources and a first set of signal loads, wherein the first set of interconnections causes a first number of crossovers in the first circuit structure, and wherein the first number of crossovers are expected to cause routing congestion during the placement and routing stage;

generate a second circuit structure which is functionally equivalent to the first circuit structure, wherein the second circuit structure includes a second set of interconnections between a second set of signal sources and a second set of signal loads, wherein the second set of interconnections causes a second number of crossovers in the second circuit structure which is substantially less than the first number of crossovers; and replace the first circuit structure in the circuit design with the second circuit structure, thereby substantially reducing crossovers in the circuit design, which, in turn, reduces routing congestion during the placement and routing stage.

18. The computer system of claim 17, wherein identifying the first circuit structure in the circuit design comprises determining whether the first circuit structure implements a set of sums-of-products expressions, wherein the set of sums-of-products expressions are associated with a common set of M minterms, and wherein a respective sum-of-products expression is a disjunction of at most M minterms; and wherein generating the second circuit structure comprises:
determining an ordering for the set of M minterms;
generating a minterm table for a respective sum-of-products expression, wherein the minterm table comprises the set of minterms associated with the respective sum-of-products expression;
partitioning the minterm table into P table partitions, wherein the minterms of a first partition are disjoint from a second partition;
generating a sum-of-products circuit structure for a respective table partition; and
generating a Boolean OR logic structure for the respective sum-of-products expression, wherein the Boolean OR logic structure combines the outputs from the sum-of-products circuit structures of the P table partitions.

19. The computer system of claim 17, wherein identifying the first circuit structure in the circuit design comprises determining whether the first circuit structure comprises at least M signal loads for one or more signal sources; and wherein generating the second circuit structure comprises:
selecting l levels of logic associated with the M signal loads;
partitioning the selected logic into at most P partitions by performing a min-cut partitioning on the selected logic;
for a respective signal source:
coupling the input signals of a respective partition to the output of a corresponding buffer; and
coupling the input of the corresponding buffer to the respective signal source.

20. The computer system of claim 17, wherein identifying the first circuit structure in the circuit design comprises determining whether the first circuit structure implements a read-only-memory (ROM), wherein the ROM has an M-bit address input; and wherein generating the second circuit structure comprises:
partitioning the first circuit structure into at most $P=2^k$ partitions, wherein a respective partition has an address input of M-k bits; and
coupling the output signals of a respective partition to a corresponding entry of a P-way multiplexer, wherein the P-way multiplexer has a select input of k bits.

21. The computer system of claim 17, wherein identifying the first circuit structure in the circuit design comprises determining whether the first circuit structure is a multiplexer, wherein the multiplexer has at most $N=2^M$ input signal sources, and has a select input of M bits; and wherein generating the second circuit structure comprises:
partitioning the first circuit structure into at most $P=2^k$ partitions, wherein a respective partition has a select input of M-k bits; and
coupling the output signals of a respective partition to a corresponding entry of a P-way multiplexer, wherein the P-way multiplexer has a select input of k bits.

22. The computer system of claim 17, wherein identifying the first circuit structure in the circuit design comprises determining whether the circuit structure is shared by at least M signal loads; and wherein generating the second circuit structure comprises:
selecting l levels of logic associated with the M signal loads;
partitioning the selected logic into at most P partitions by performing a min-cut partitioning on the selected logic; and
producing an instantiation of the first circuit structure for a respective partition of the signal loads.

23. The computer system of claim 17, wherein identifying the first circuit structure in the circuit design comprises:
determining whether the first circuit structure implements a decompression logic for M design-for-test (DFT) scan chains, wherein the decompression logic produces a set of output signals, wherein a respective output signal drives a corresponding DFT scan chain, and wherein a respective DFT scan chain is implemented by a register chain; and
wherein generating the second circuit structure comprises:
partitioning the M scan chains into P partitions of scan chains; and
generating a local implementation of the DFT decompressor for a respective DFT scan chain in a partition $P_i$ by sharing logic with local DFT decompressor implementations for other scan chains in partition $P_i$.

24. The computer system of claim 17, wherein identifying the first circuit structure in the circuit design comprises:
determining whether the first circuit structure implements a compression logic for M design-for-test (DFT) scan chains, wherein a respective DFT scan chain is implemented by a register chain, wherein the compression logic comprises M input signal loads, and wherein the compression logic produces a compressed signal output for the M DFT scan chains; and
wherein generating the second circuit structure comprises:
determining an ordering for the M DFT scan chains based on their placement sequence;
determining an ordering for the M signal loads of the compression logic based on their placement sequence; and
coupling the output signals of the M DFT scan chains to the M input signal loads of the compression logic based on their corresponding orderings.

* * * * *